United States Patent
Choi et al.

(10) Patent No.: US 12,449,448 B2
(45) Date of Patent: Oct. 21, 2025

(54) SEMICONDUCTOR DEVICE HAVING SHIELDING STRUCTURE

(71) Applicant: SK hynix Inc., Icheon-si (KR)

(72) Inventors: Suk Hwan Choi, Icheon-si (KR); Sun Beom Lee, Icheon-si (KR); Jong Seok Jung, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 162 days.

(21) Appl. No.: 18/307,563

(22) Filed: Apr. 26, 2023

(65) Prior Publication Data
US 2024/0159802 A1    May 16, 2024

(30) Foreign Application Priority Data
Nov. 15, 2022    (KR) .................. 10-2022-0152745

(51) Int. Cl.
*G01R 19/00*    (2006.01)
*H03K 3/01*    (2006.01)

(52) U.S. Cl.
CPC ........... *G01R 19/0084* (2013.01); *H03K 3/01* (2013.01)

(58) Field of Classification Search
CPC .............................. G01R 19/0084; H03K 3/01
See application file for complete search history.

(56) References Cited

U.S. PATENT DOCUMENTS

| 8,847,431 B2 * | 9/2014 | Shido .................. H01L 23/5225 |
| | | 307/91 |
| 9,350,329 B2 | 5/2016 | Kim |
| 2016/0006419 A1 | 1/2016 | Kim |

FOREIGN PATENT DOCUMENTS

| KR | 10-2004-0075244 A | 8/2004 |
| KR | 10-2009-0040546 A | 4/2009 |
| WO | WO-0213689 A2 * | 2/2002 ......... A61B 5/04004 |

* cited by examiner

*Primary Examiner* — Lincoln D Donovan
*Assistant Examiner* — James G Yeaman

(57) ABSTRACT

A semiconductor device includes a sensing voltage line disposed between a first circuit area and a second circuit area, and configured to transfer a sensing voltage detected in the second circuit area to the first circuit area; and a first internal voltage line disposed between the first circuit area and the second circuit area, configured to transfer an internal voltage, generated by a voltage driver of the first circuit area using the sensing voltage provided through the sensing voltage line, to the second circuit area and configured to shield the sensing voltage line.

20 Claims, 10 Drawing Sheets

SEMICONDUCTOR DEVICE HAVING SHIELDING STRUCTURE

CROSS-REFERENCE TO RELATED APPLICATION

The present application claims priority under 35 U.S.C. § 119(a) to Korean Patent Application No. 10-2022-0152745 filed in the Korean Intellectual Property Office on Nov. 15, 2022, which is incorporated herein by reference in its entirety.

BACKGROUND

1. Technical Field

Various embodiments generally relate to a semiconductor technology, and particularly, to a semiconductor device having a shielding structure.

2. Related Art

As semiconductor circuits trend toward higher speeds, lower power consumption and a higher degree of integration, the size of cells is decreasing, and operating voltage is also decreasing due to the decreased cell size.

Most semiconductor chips are provided with a voltage driver for generating an internal voltage using a power supply voltage supplied from the outside. Semiconductor chips self-supply the voltage necessary for the operation of internal circuits of the chips. A major issue in designing a voltage driver is the need to keep an internal voltage constant at a desired level.

The voltage driver generates an internal voltage by dividing the difference between a reference voltage and the voltage of a ground node at a predetermined division ratio. Ideally, the voltage of the ground node is 0V, but the voltage level of the ground node may rise due to an increase in operating current of an internal circuit and/or a resistance value of a ground voltage line. As the difference between the reference voltage and the voltage of the ground node decreases, the level of the voltage outputted from the voltage driver also decreases.

To account for this effect, a method can be used to sense the voltage of the ground node, or a node having a potential proportional to the potential of the ground node, in order to compensate for a lowered voltage by changing an output voltage level of the voltage driver in the same phase in response to a level variation in a sensing voltage.

However, since the sensing voltage has poor noise immunity, problems may arise in that the level of the sensing voltage easily becomes unstable, so the level of the internal voltage generated using the sensing voltage also becomes unstable, and a circuit using the internal voltage is likely to operate in an unpredictable manner. That is to say, there arises a problem in that the operation of the semiconductor device becomes unreliable.

SUMMARY

Various embodiments are directed to a semiconductor device capable of stabilizing the level of a sensing voltage by preventing or suppressing noise from entering a sensing voltage line and improving reliability by stabilizing the level of an internal voltage generated using the sensing voltage.

Also, various embodiments are directed to a semiconductor device capable of shielding a sensing voltage line without increasing the complexity of wiring.

In an embodiment, a semiconductor device may include: a sensing voltage line disposed between a first circuit area and a second circuit area, and configured to transfer a sensing voltage detected in the second circuit area to the first circuit area; and a first internal voltage line disposed between the first circuit area and the second circuit area, and configured to transfer an internal voltage, generated by a voltage driver of the first circuit area using the sensing voltage provided through the sensing voltage line, to the second circuit area and shield the sensing voltage line.

In an embodiment, a semiconductor device may include: a first voltage driver disposed in a first circuit area, and configured to generate a first internal voltage whose level changes according to a variation in a level of a sensing voltage detected in a second circuit area; a second voltage driver disposed in the second circuit area, and configured to generate a second internal voltage using the first internal voltage; a sensing voltage line disposed between the first circuit area and the second circuit area, and configured to transfer the sensing voltage to the first voltage driver; and a first internal voltage line disposed between the first circuit area and the second circuit area, and configured to transfer the first internal voltage generated by the first voltage driver to the second voltage driver and shield the sensing voltage line.

DETAILED DESCRIPTION

Figure 1:
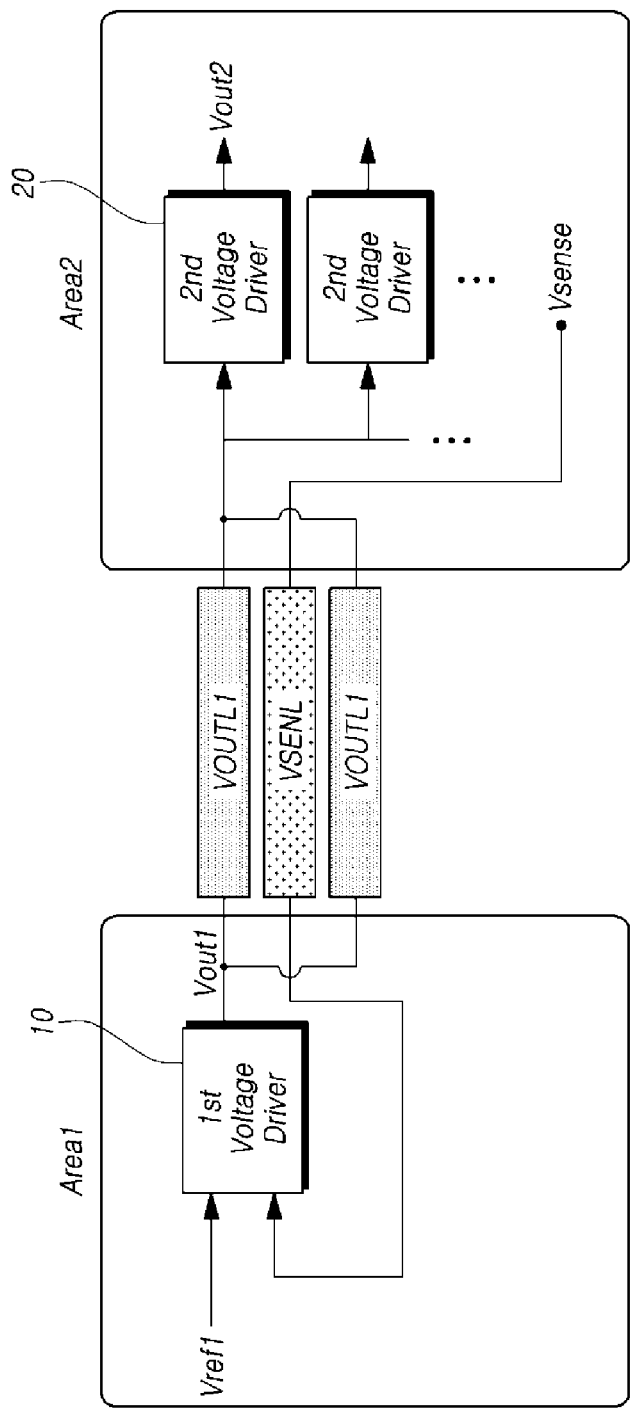
FIG. 1 is a configuration diagram of a semiconductor device according to an embodiment of the disclosure.

Advantages and features of the disclosure and methods to achieve them will become apparent from the descriptions of exemplary embodiments herein below with reference to the accompanying drawings. However, the present disclosure is not limited to the exemplary embodiments disclosed herein but may be implemented in various different ways. The exemplary embodiments are provided for making the disclosure of the present disclosure thorough and for fully conveying the scope of the present disclosure to those skilled in the art. It is to be noted that the scope of the present disclosure is defined only by the claims.

Since the figures, dimensions, ratios, angles, numbers of elements given in the drawings to describe embodiments of the disclosure are merely illustrative, the present disclosure is not limited to the illustrated matters. Throughout the specification, like reference numerals refer to like components. In describing the disclosure, when it is determined that the detailed description of the related art may obscure the gist of the disclosure, the detailed description thereof will be omitted. It is to be noticed that the terms "comprising," "having," "including" and so on, used in the description and claims, should not be interpreted as being restricted to the means listed thereafter unless specifically stated otherwise. Where an indefinite or definite article, e.g., "a," "an" or "the," is used when referring to a singular noun, this may include a plural of that noun unless specifically stated otherwise.

In interpreting elements in embodiments of the disclosure, they should be interpreted as including error margins even without explicit statements.

Also, in describing the components of the disclosure, there may be used terms such as first, second, A, B, (a), and (b). These are solely for the purpose of differentiating one component from another component but do not limit the substances, order, sequence or number of the components. Also, components in embodiments of the disclosure are not limited by these terms. These terms are used to merely distinguish one component from another component. Accordingly, as used herein, a first component may be a second component within the technical spirit of the disclosure.

If a component is described as "connected," "coupled" or "linked" to another component, it may mean that the component is not only directly "connected," "coupled" or "linked" but also is indirectly "connected," "coupled" or "linked" via a third component. In describing positional relationships, such as "an element A on an element B," "an element A above an element B," "an element A below an element B" and "an element A next to an element B," one or more other elements may be disposed between the elements A and B unless the term "directly" or "immediately" is explicitly used.

Features of various exemplary embodiments of the disclosure may be coupled, combined or separated partially or totally. Various interactions and operations are technically possible. Various exemplary embodiments can be practiced individually or in combination.

Hereinafter, various examples of embodiments of the disclosed technology will be described in detail with reference to the accompanying drawings.

Figure 2:
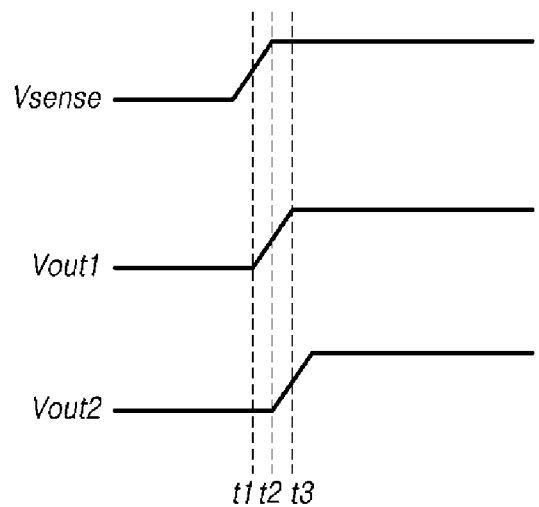
FIG. 2 is a timing diagram of main signals generated in a semiconductor device according to an embodiment of the disclosure.

FIG. 1 is a configuration diagram of a semiconductor device according to an embodiment of the disclosure, and FIG. 2 is a timing diagram of main signals generated in the semiconductor device according to an embodiment of the disclosure.

Referring to FIG. 1, a semiconductor device may include a sensing voltage line VSENL, which is disposed between a first circuit area Area1 and a second circuit area Area1. The sensing voltage line VSENL transfers a sensing voltage Vsense detected in the second circuit area Area1 to the first circuit area Area1. A first internal voltage line VOUTL1, which is disposed between the first circuit area Area1 and the second circuit area Area1, transfers a first internal voltage Vout1 generated by a first voltage driver 10 of the first circuit area Area1 using the sensing voltage Vsense provided through the sensing voltage line VSENL. The first internal voltage line VOUTL1 also shields the sensing voltage line VSENL.

In detail, at least one voltage driver may be disposed in each of the first circuit area Area1 and the second circuit area Area1. Hereinafter, for the sake of convenience in explanation, a voltage driver disposed in the first circuit area Area1 is defined as a first voltage driver 10, and a voltage driver disposed in the second circuit area Area1 is defined as a second voltage driver 20.

The first voltage driver 10 may generate an internal voltage using a first reference voltage Vref1, and may generate the first internal voltage Vout1 by changing the level of the internal voltage according to a level variation of the sensing voltage Vsense provided from the second circuit area Area1 through the sensing voltage line VSENL.

In other words, when the level of the sensing voltage Vsense varies, the first voltage driver 10 may change the level of the first internal voltage Vout1 so that the first internal voltage Vout1 has the same phase as the sensing voltage Vsense.

The first internal voltage Vout1 generated by the first voltage driver 10 may be transferred to the second circuit area Area1 through the first internal voltage line VOUTL1.

The first internal voltage line VOUTL1 may be disposed in the vicinity of the sensing voltage line VSENL between the first circuit area Area1 and the second circuit area Area1 to shield the sensing voltage line VSENL. For example, the first internal voltage line VOUTL1 may be disposed adjacent to, and on both sides of, the sensing voltage line VSENL.

The second voltage driver 20 may receive the first internal voltage Vout1 through the first internal voltage line VOUTL1, and may generate a second internal voltage Vout2 by dividing the difference between the first internal voltage Vout1 and the voltage of a local ground node at a predetermined division ratio. The sensing voltage Vsense may be the voltage of a specific node of the second circuit area Area1, and the specific node may be the local ground node of the second circuit area Area1, or a node having a potential proportional to the potential of the local ground node of the second circuit area Area1.

Ideally, the potential of the local ground node should be maintained at 0V. However, the voltage level of the local ground node of the second circuit area Area1 may rise in proportion to the resistance value of a ground voltage line, which increases as the operating current of an internal circuit increases or as a distance from a pad for a ground voltage increases. Consequently, the level of the output voltage of the second voltage driver 20 can be affected.

In detail, the second voltage driver 20 generates the second internal voltage Vout2 by dividing the difference between the first internal voltage Vout1 and the voltage of the local ground node at the predetermined division ratio. If the level of the voltage of the local ground node rises, then the difference between the first internal voltage Vout1 and the voltage of the local ground node decreases, and thus, the level of the second internal voltage Vout2 generated by the second voltage driver 20 decreases.

If the level of the second internal voltage Vout2 decreases, then a circuit that operates using the second internal voltage Vout2 is unlikely to properly operate, and the possibility of a functional error to occur increases.

When the voltage of the local ground node rises, that is, when the level of the sensing voltage Vsense rises, the first voltage driver 10 may increase the level of the first internal voltage Vout1 such that the first internal voltage Vout1 has the same phase as the sensing voltage Vsense. Therefore, even though the voltage of the local ground node rises, it is possible to prevent a decreasing difference between the first internal voltage Vout1 and the voltage of the local ground node and to prevent the level of the second internal voltage Vout2 from decreasing.

As shown in FIG. 2, when the sensing voltage Vsense increases, the level of the first internal voltage Vout1 is increased according to the sensing voltage Vsense by the first voltage driver 10, which receives the sensing voltage Vsense, and then, the level of the second internal voltage Vout2 is increased according to the first internal voltage Vout1. The second voltage driver 20, which receives the first internal voltage Vout1, increases the level of the second internal voltage Vout2.

The first internal voltage Vout1 has high noise immunity because the first voltage driver 10 strongly drives the first internal voltage Vout1, whereas the sensing voltage Vsense is vulnerable to noise.

As described above, the levels of the first internal voltage Vout1 and the second internal voltage Vout2 vary according to the level of the sensing voltage Vsense. If the level of the sensing voltage Vsense becomes unstable as noise enters the sensing voltage line VSENL, then the levels of the first internal voltage Vout1 and the second internal voltage Vout2 become unstable, and the possibility increases for functional errors to occur in an internal circuit that operates using the first internal voltage Vout1 and the second internal voltage Vout2.

According to embodiments of the disclosed technology, since the sensing voltage line VSENL is shielded using the first internal voltage line VOUTL1, which is loaded with the first internal voltage Vout1 having high noise immunity, the level of the sensing voltage Vsense may be stabilized by preventing noise from entering the sensing voltage line VSENL. As a result, the levels of the first internal voltage Vout1 and the second internal voltage Vout2 generated using the sensing voltage Vsense may be stabilized, and it is possible to prevent a functional error from occurring in an internal circuit that operates using the first internal voltage Vout1 and the second internal voltage Vout2 and improve reliability.

Also, since a separate wiring line is not used to shield the sensing voltage line VSENL, the sensing voltage line VSENL may be shielded without increasing the complexity of wiring.

The disclosed technology is not limited to the above-described structure, which may be changed to various forms.

FIGS. 3 to 7 are diagrams illustrating various examples of semiconductor devices according to embodiments of the disclosure.

For the sake of simplicity in explanation, in the following descriptions to be made with reference to FIGS. 3 to 7, repeated descriptions for the same components will be omitted, and the description will focus mainly on differences among FIGS. 3 to 7.

Figure 3:
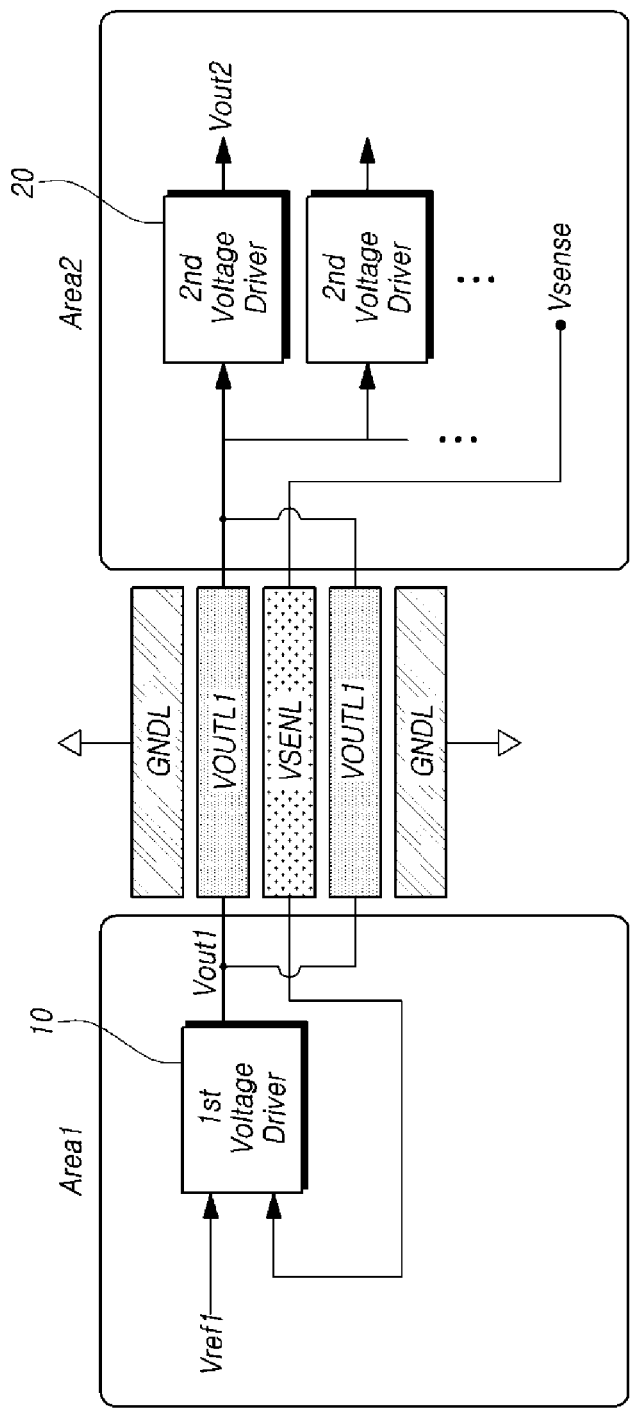
FIGS. 3 to 7 are diagrams illustrating various examples of semiconductor devices according to embodiments of the disclosure.

Referring to FIG. 3, between a first circuit area Area1 and a second circuit area Area1, a first internal voltage line VOUTL1 may be disposed in the vicinity of a sensing voltage line VSENL to shield the sensing voltage line VSENL. A ground voltage line GNDL, which shields the first internal voltage line VOUTL1, may be disposed in the vicinity of the first internal voltage line VOUTL1.

The ground voltage line GNDL may be disposed to be separated from the sensing voltage line VSENL, with the first internal voltage line VOUTL1 interposed therebetween. The first internal voltage line VOUTL1 may be disposed between the ground voltage line GNDL and the sensing voltage line VSENL to shield the sensing voltage line VSENL so that noise of the ground voltage line GNDL is prevented from entering or affecting the sensing voltage line VSENL.

Since the sensing voltage line VSENL is shielded by the first internal voltage line VOUTL1, which has high noise immunity, even if noise enters the ground voltage line GNDL, it is possible to prevent or suppress noise of the ground voltage line GNDL from being transferred to the sensing voltage line VSENL.

Figure 4:
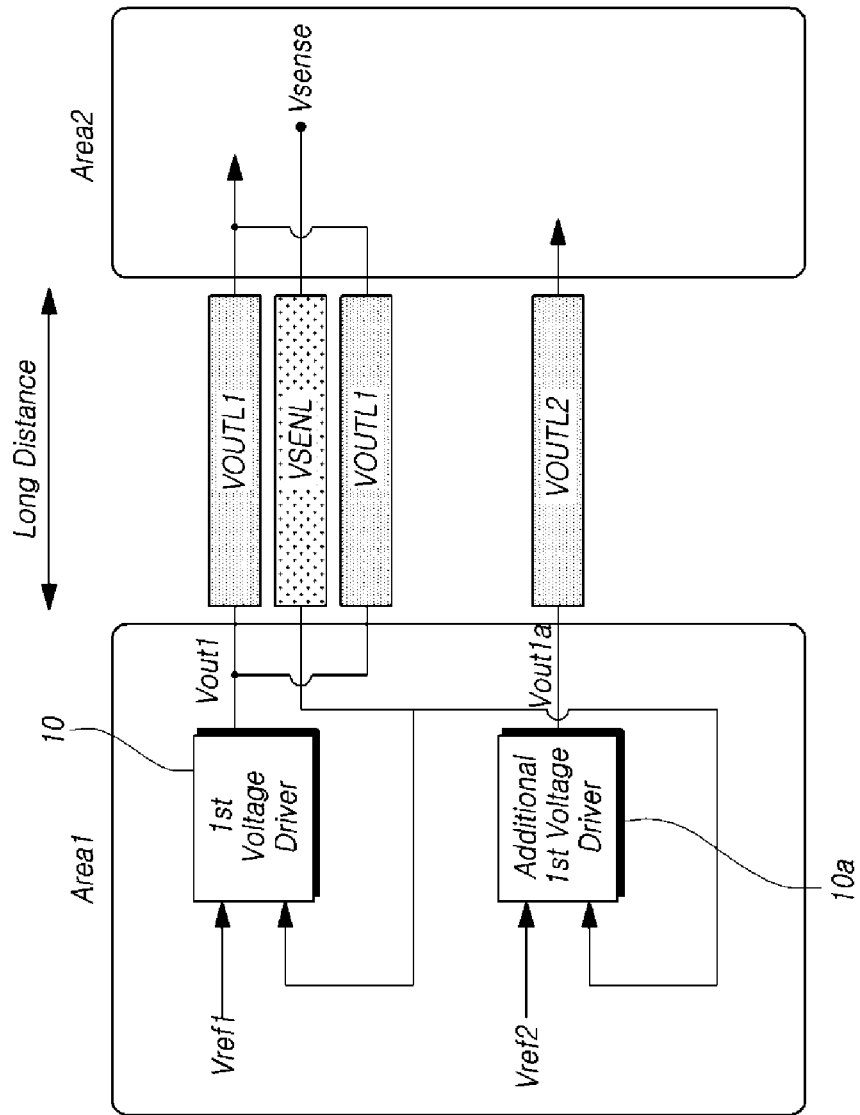

Referring to FIG. 4, the semiconductor device may further include an additional first voltage driver 10a and a second internal voltage line VOUTL2.

The additional first voltage driver 10a may be disposed in the first circuit area Area1, may generate an internal voltage using a second reference voltage Vref2, and may generate an additional first internal voltage Vout1a by changing the level of the internal voltage according to a variation in the level of the sensing voltage Vsense inputted through the sensing voltage line VSENL.

The second internal voltage line VOUTL2 may be disposed between the first circuit area Area1 and the second circuit area Area1, and may transfer the additional first internal voltage Vout1a generated by the additional first voltage driver 10a to the second circuit area Area1.

Figure 5:
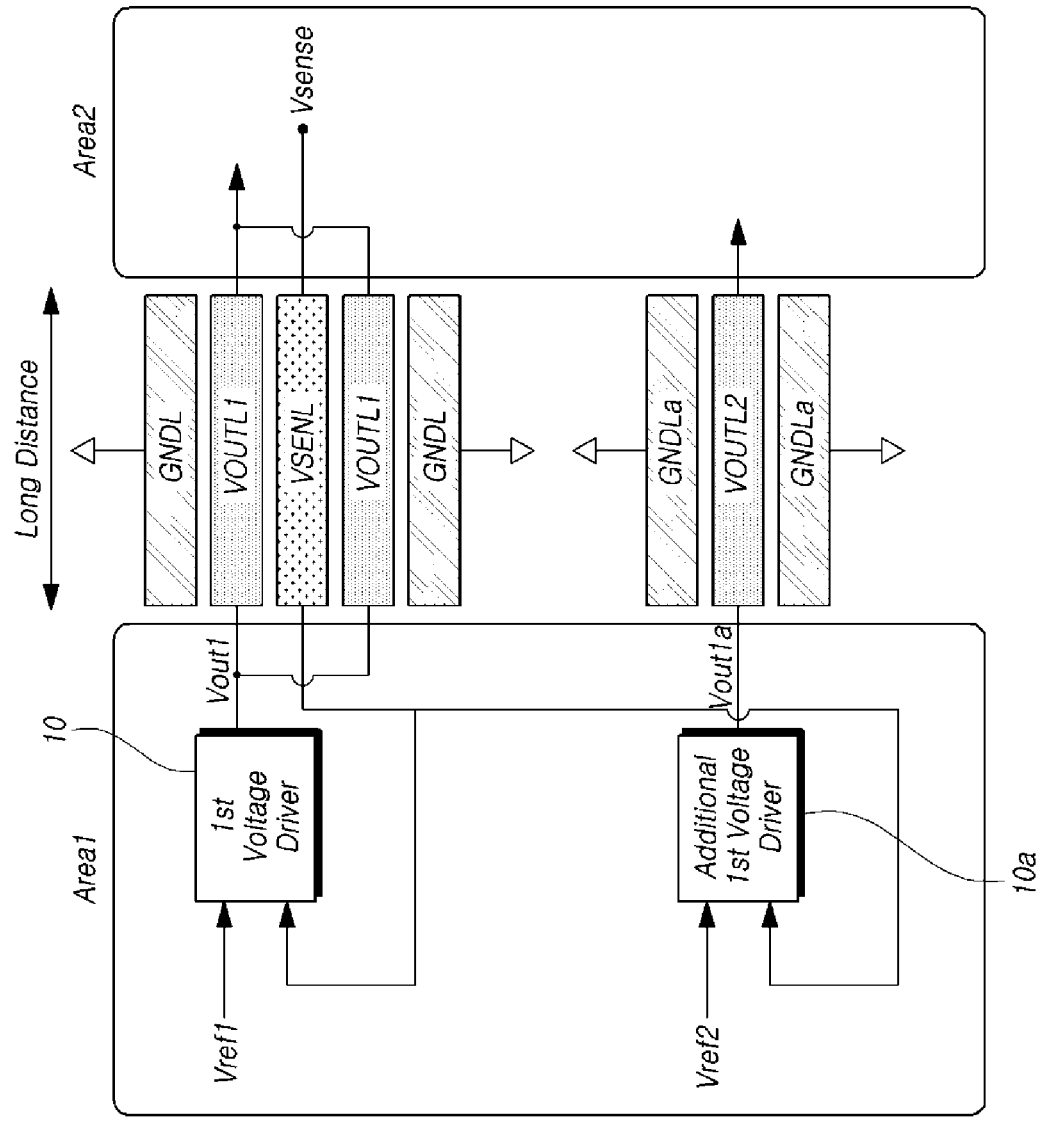

Referring to FIG. 5, between the first circuit area Area1 and the second circuit area Area1, the first internal voltage line VOUTL1, which shields the sensing voltage line VSENL, may be disposed in the vicinity of the sensing voltage line VSENL, and the ground voltage line GNDL, which shields the first internal voltage line VOUTL1, may be disposed in the vicinity of the first internal voltage line VOUTL1.

The first internal voltage line VOUTL1 may be disposed adjacent to, and on both sides of, the sensing voltage line VSENL, and the ground voltage line GNDL may be disposed to be separated from the sensing voltage line VSENL with the first internal voltage line VOUTL1 interposed therebetween.

The first internal voltage line VOUTL1 may be disposed between the sensing voltage line VSENL and the ground voltage line GNDL to shield the sensing voltage line VSENL so that noise of the ground voltage line GNDL is prevented from entering or affecting the sensing voltage line VSENL.

Since the sensing voltage line VSENL is shielded by the first internal voltage line VOUTL1, which has high noise immunity, even if noise enters the ground voltage line GNDL, it is possible to prevent or suppress noise of the ground voltage line GNDL from being transferred to the sensing voltage line VSENL.

An additional ground voltage line GNDLa, which shields the second internal voltage line VOUTL2, may be disposed in the vicinity of the second internal voltage line VOUTL2. The additional ground voltage line GNDLa may play a role in preventing noise from entering or affecting the second internal voltage line VOUTL2.

Figure 6:
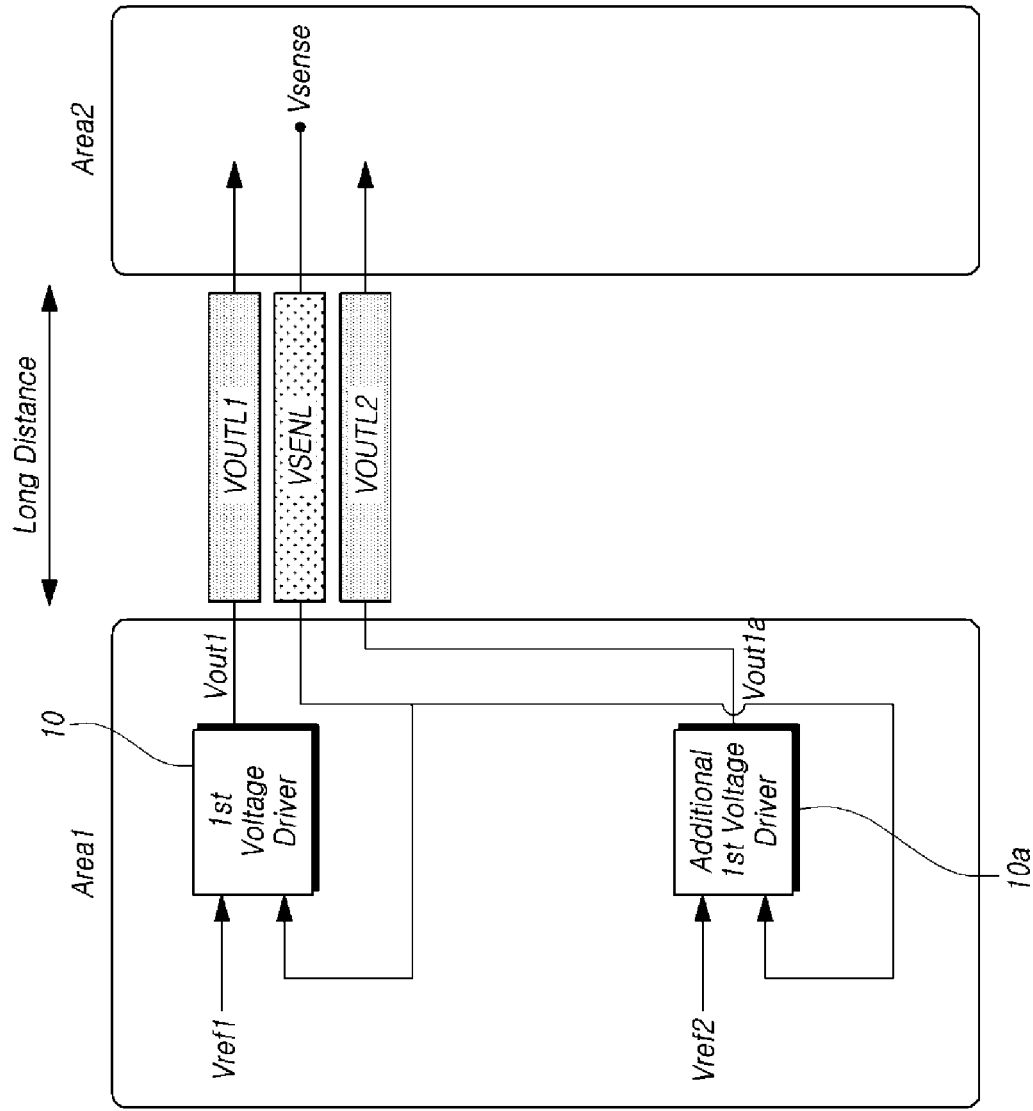

Referring to FIG. 6, between the first circuit area Area1 and the second circuit area Area1, a first internal voltage line VOUTL1 and a second internal voltage line VOUTL2 may be disposed in the vicinity of the sensing voltage line VSENL to shield the sensing voltage line VSENL.

For example, the first internal voltage line VOUTL1 and the second internal voltage line VOUTL2 may be disposed on opposite sides, respectively, of the sensing voltage line VSENL to shield the sensing voltage line VSENL.

Since the sensing voltage line VSENL is shielded by the first and second internal voltage lines VOUTL1 and VOUTL2, when compared to a case in which the sensing voltage line VSENL is shielded by branching one internal voltage line into two, the number of wiring lines may be reduced, and the design of wiring may be easily carried out by reducing the complexity of wiring.

Figure 7:
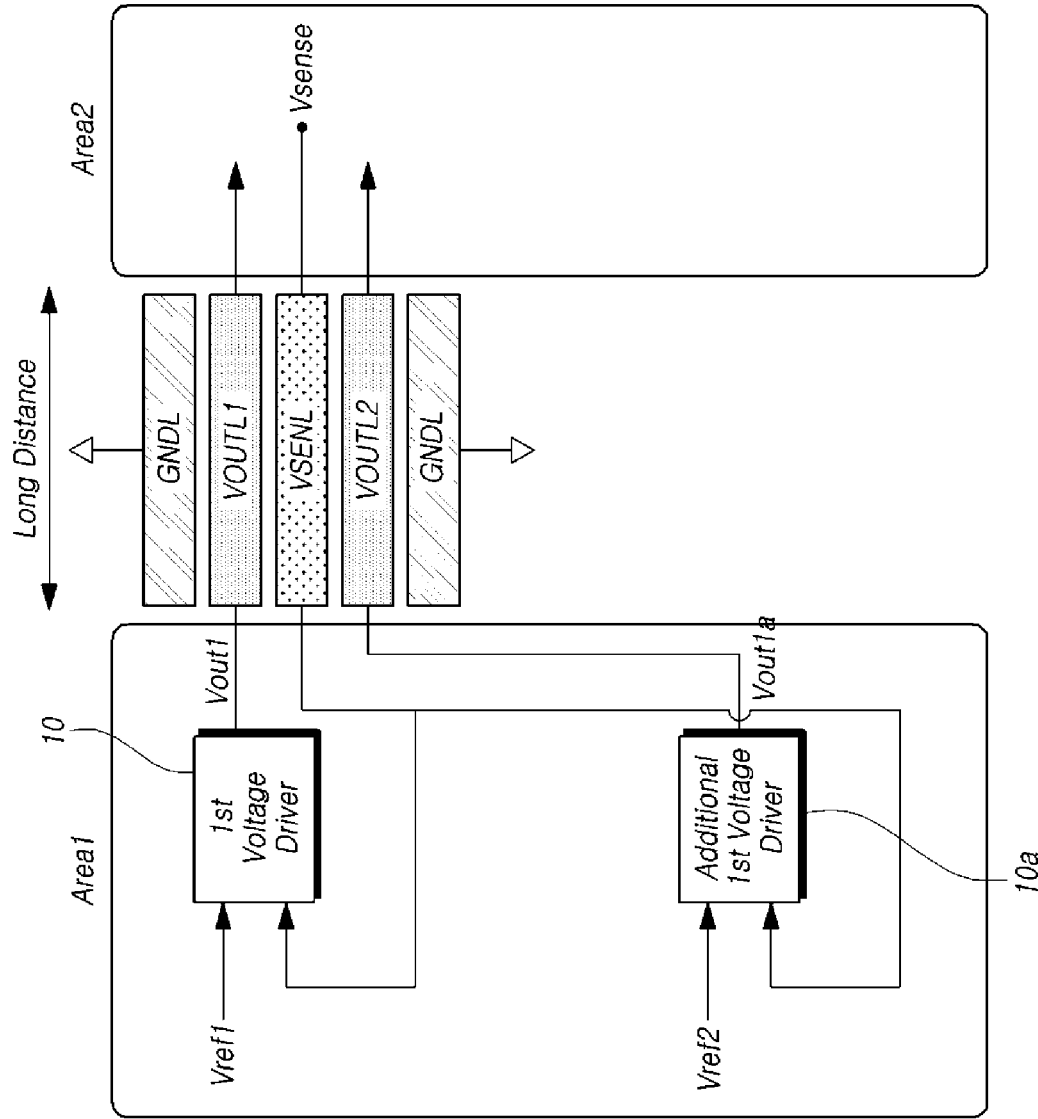

Referring to FIG. 7, the first and second internal voltage lines VOUTL1 and VOUTL2, which shield the sensing voltage line VSENL, may be disposed between the first circuit area Area1 and the second circuit area Area1. A ground voltage line GNDL, which shields the first and second internal voltage lines VOUTL1 and VOUTL2, may also be disposed between the first circuit area Area1 and the second circuit area Area1.

The first internal voltage line VOUTL1 and the second internal voltage line VOUTL2 may be disposed adjacent to, and on opposite sides of, the sensing voltage line VSENL, and the ground voltage line GNDL may be disposed to be separated from the sensing voltage line VSENL with the first internal voltage line VOUTL1 or the second internal voltage line VOUTL2 interposed therebetween.

The first internal voltage line VOUTL1 and the second internal voltage line VOUTL2 may be disposed between the sensing voltage line VSENL and the ground voltage line GNDL to shield the sensing voltage line VSENL so that noise of the ground voltage line GNDL is prevented from entering or affecting the sensing voltage line VSENL.

Figure 8:
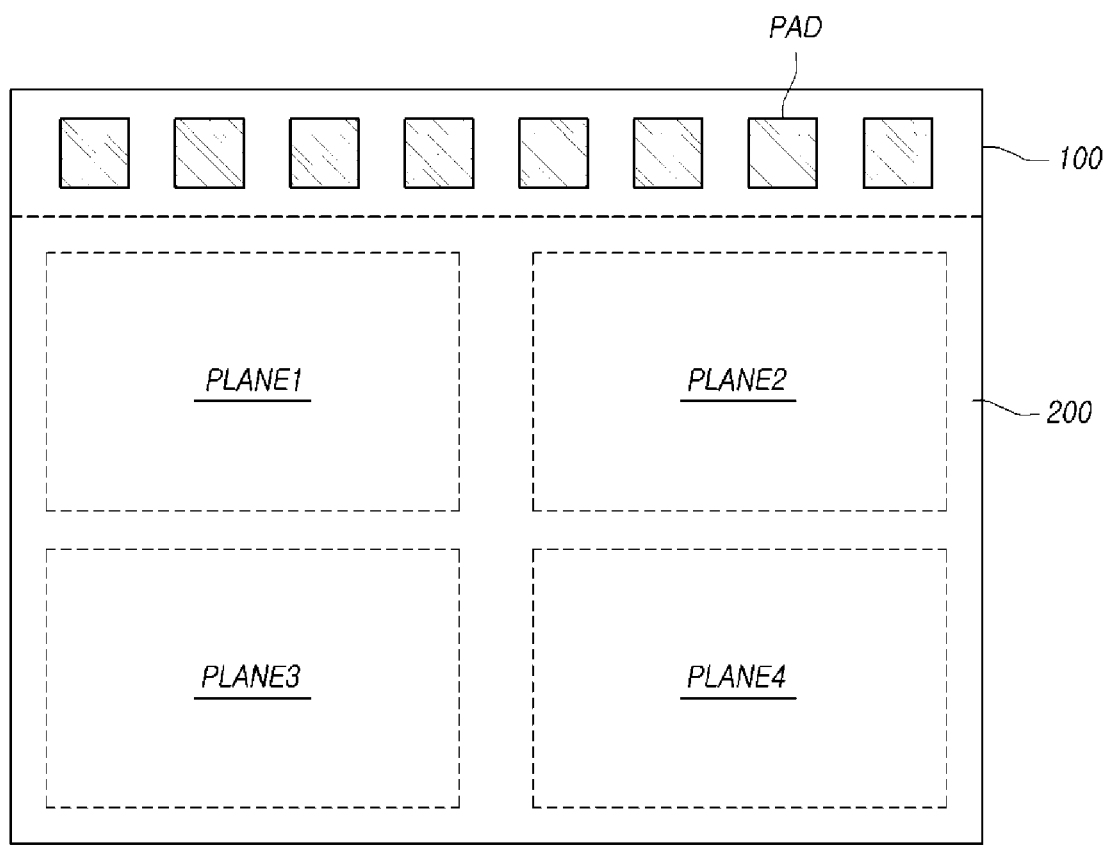
FIG. 8 is a top view illustrating a schematic layout of a memory device including a semiconductor device according to an embodiment of the disclosure.

FIG. 8 is a top view illustrating a schematic layout of a memory device including a semiconductor device according to an embodiment of the disclosure.

Referring to FIG. 8, a memory device may include a plurality of plane areas PLANE1 to PLANE4, a pad area 100 and a peripheral circuit area 200.

For example, the memory device may have a 4-plane structure. The four plane areas PLANE1 to PLANE4 included in the memory device may be disposed in a 2×2 matrix form. Although not illustrated, a memory cell array, a row decoder and a page buffer circuit may be disposed in each of the plane areas PLANE1 to PLANE4.

A plurality of pads PAD may be disposed in the pad area 100.

The pads PAD are external contacts of the memory device for electrical coupling with an external device. The pads PAD may be coupled to a printed circuit board (not illustrated) through, for example, wires. Although not illustrated, the wires may have one end bonded to the pads PAD, and the other end of the wires may be bonded to bond fingers of the printed circuit board.

The peripheral circuit area 200 may correspond to an area other than the pad area 100 and the plane areas PLANE1 to PLANE4.

The first voltage driver (10 of FIG. 1) and the second voltage driver (20 of FIG. 1) of a semiconductor device according to the disclosed technology may provide voltages to different plane areas.

In order to reduce the length of a path that transfers an internal voltage from a voltage driver to a plane area, the voltage driver may be disposed at a location close to the plane area using the internal voltage provided by the voltage driver.

For example, where the first voltage driver (10 of FIG. 1) provides an operating voltage to the first plane area PLANE1 and the second voltage driver (20 of FIG. 1) provides an operating voltage to the second plane area PLANE2, the first voltage driver (10 of FIG. 1) may be disposed in the peripheral circuit area 200 adjacent to the first plane area PLANE1, and the second voltage driver (20 of FIG. 1) may be disposed in the peripheral circuit area 200 adjacent to the second plane area PLANE2.

For this reason, the first voltage driver (10 of FIG. 1) and the second voltage driver (20 of FIG. 1) may be disposed far apart from each other, and the sensing voltage line VSENL may be configured to have a long length that couples the first voltage driver (10 of FIG. 1) and the second voltage driver (20 of FIG. 1). Thus, the sensing voltage line VSENL may be affected by many circuits and wiring lines disposed in the vicinity of a path through which the sensing voltage line VSENL passes, so noise may affect the sensing voltage line VSENL.

According to embodiments of the disclosed technology, by shielding the sensing voltage line VSENL using the internal voltage lines VOUTL1 and VOUTL2, which have high noise immunity, it is possible to prevent noise from entering the sensing voltage line VSENL. Therefore, the level of the sensing voltage Vsense may be stabilized, and the levels of the internal voltages Vout1 and Vout2 generated using the sensing voltage Vsense may be stabilized, whereby it is possible to prevent a functional error from occurring in a circuit that operates using an internal voltage and to improve reliability.

Figure 9:
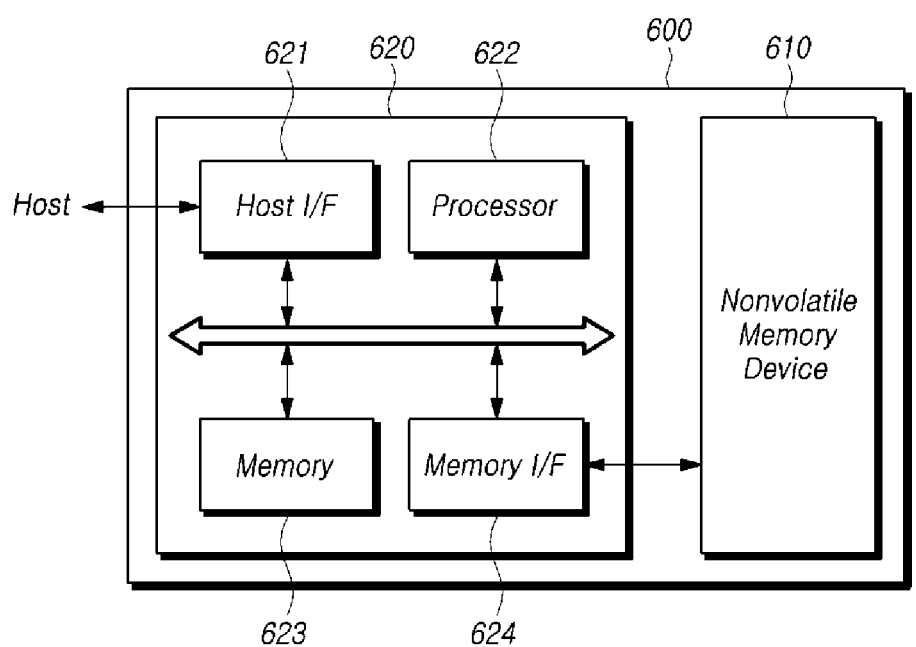
FIG. 9 is a block diagram schematically illustrating a memory system including a semiconductor device according to an embodiment of the disclosure.

FIG. 9 is a block diagram schematically illustrating a memory system including a semiconductor device according to an embodiment of the disclosure.

Referring to FIG. 9, a memory system 600 may store data to be accessed by a host such as a mobile phone, an MP3 player, a laptop computer, a desktop computer, a game machine, a TV, an in-vehicle infotainment system, and so forth.

The memory system 600 may be manufactured as any one of various kinds of storage devices according to the protocol of an interface which is electrically coupled with the host. For example, the memory system 600 may be configured as any one of various kinds of storage devices such as a solid state drive, a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a Personal Computer Memory Card International Association (PCMCIA) card type storage device, a peripheral component interconnection (PCI) card type storage device, a PCI express (PCI-E) card type storage device, a compact flash (CF) card, a smart media card, a memory stick, and so forth.

The memory system 600 may be manufactured as any one among various kinds of package types. For example, the memory system 600 may be manufactured as any one of various kinds of package types such as a package-on-package (POP), a system-in-package (SIP), a system-on-chip (SOC), a multi-chip package (MCP), a chip-on-board (COB), a wafer-level fabricated package (WFP) and a wafer-level stack package (WSP).

The memory system 600 may include a nonvolatile memory device 610 and a controller 620.

The nonvolatile memory device 610 may operate as a storage medium of the memory system 600. The nonvolatile memory device 610 may be configured by any one of various types of nonvolatile memory devices such as a NAND flash memory device, a NOR flash memory device, a ferroelectric random access memory (FRAM) using a ferroelectric capacitor, a magnetic random access memory (MRAM) using a tunneling magneto-resistive (TMR) layer, a phase change random access memory (PRAM) using a chalcogenide alloy, and a resistive random access memory (RERAM) using a transition metal compound, depending on the type of memory cells.

While FIG. 9 illustrates that the memory system 600 includes one nonvolatile memory device 610, this is only for the sake of convenience in explanation, and the memory system 600 may include a plurality of nonvolatile memory devices. The disclosed technology may be applied the same to the memory system 600 including a plurality of nonvolatile memory devices. The nonvolatile memory device 610 may include the semiconductor device based on the embodiment of the disclosed technology.

The controller 620 may control general operations of the memory system 600 through driving of firmware or software loaded in a memory 623. The controller 620 may decode and drive a code type instruction or algorithm such as firmware or software. The controller 620 may be implemented in the form of hardware or in a combined form of hardware and software.

The controller 620 may include a host interface 621, a processor 622, the memory 623 and a memory interface 624. Although not illustrated in FIG. 9, the controller 620 may further include an ECC (error correction code) engine which generates a parity by ECC-encoding write data provided from the host and ECC-decodes read data, read from the nonvolatile memory device 610, by using the parity.

The host interface 621 may interface the host and the memory system 600 in correspondence to the protocol of the host. For example, the host interface 621 may communicate with the host through any one of universal serial bus (USB), universal flash storage (UFS), multimedia card (MMC), parallel advanced technology attachment (PATA), serial advanced technology attachment (SATA), small computer system interface (SCSI), serial attached SCSI (SAS), peripheral component interconnection (PCI) and PCI express (PCI-E) protocols.

The processor 622 may be configured by a micro control unit (MCU) or a central processing unit (CPU). The processor 622 may process a request transmitted from the host. In order to process a request transmitted from the host, the processor 622 may drive a code type instruction or algorithm, that is, firmware, loaded in the memory 623, and may control the internal function blocks such as the host interface 621, the memory 623 and the memory interface 624 and the nonvolatile memory device 610.

The processor 622 may generate control signals for controlling the operation of the nonvolatile memory device 610, on the basis of requests transmitted from the host, and may provide the generated control signals to the nonvolatile memory device 610 through the memory interface 624.

The memory 623 may be configured by a random access memory such as a dynamic random access memory (DRAM) or a static random access memory (SRAM). The memory 623 may store firmware to be driven by the processor 622. Also, the memory 623 may store data necessary for driving the firmware, for example, metadata. Namely, the memory 623 may operate as a working memory of the processor 622.

The memory 623 may be configured to include a data buffer for temporarily storing write data to be transmitted from the host to the nonvolatile memory device 610 or read data to be transmitted from the nonvolatile memory device 610 to the host. In other words, the memory 623 may operate as a buffer memory. The memory 623 may receive and store map data from the nonvolatile memory device 610 when the memory system 600 is booted.

The memory interface 624 may control the nonvolatile memory device 610 according to the control of the processor 622. The memory interface 624 may also be referred to as a memory controller. The memory interface 624 may provide control signals to the nonvolatile memory device 610. The control signals may include a command, an address, an operation control signal and so forth for controlling the nonvolatile memory device 610. The memory interface 624 may provide data, stored in the data buffer, to the nonvolatile memory device 610, or may store data, transmitted from the nonvolatile memory device 610, in the data buffer.

The controller 620 may further include a map cache (not illustrated) which caches map data referred to by the processor 622 among map data stored in the memory 623.

Figure 10:
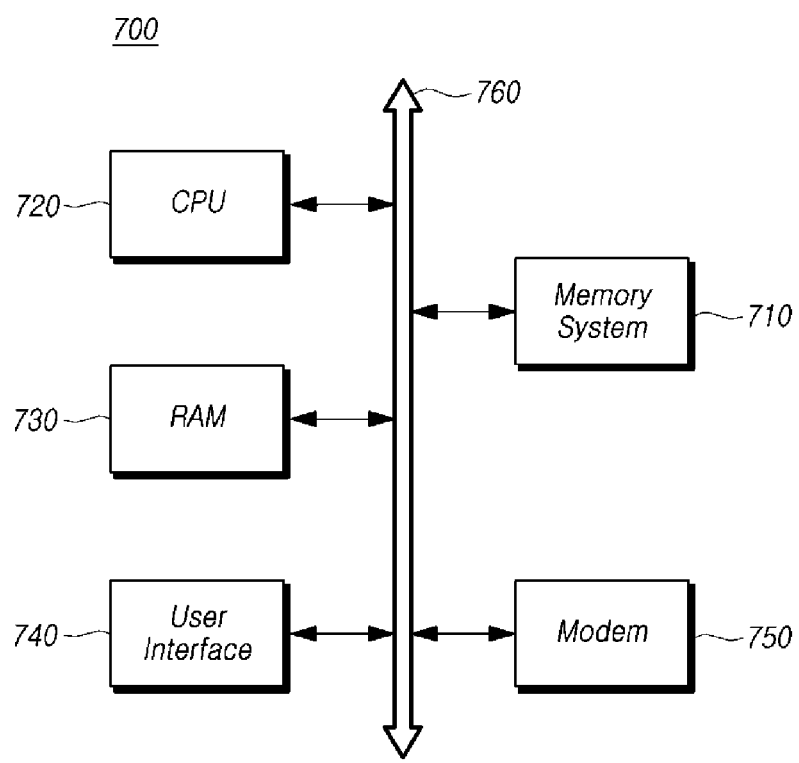
FIG. 10 is a block diagram schematically illustrating a computing system including a semiconductor device according to an embodiment of the disclosure.

FIG. 10 is a block diagram schematically illustrating a computing system including a semiconductor device according to an embodiment of the disclosure.

Referring to FIG. 10, a computing system 700 based on an embodiment of the disclosed technology may include a memory system 710, a microprocessor (CPU) 720, a RAM 730, a user interface 740 and a modem 750 such as a baseband chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to those skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, a OneNAND flash memory).

The above-described exemplary embodiment of the disclosure may be implemented not only through an apparatus and method but also through a program that realizes a function corresponding to a configuration of the exemplary embodiment of the disclosure or through a recording medium on which the program is recorded, and can be easily implemented by a person of ordinary skill in the art from the description of the foregoing exemplary embodiment.

Although various embodiments of the disclosed technology have been described with particular specifics and varying details for illustrative purposes, those skilled in the art will appreciate that various modifications, additions and substitutions may be made based on what is disclosed or illustrated in the present disclosure without departing from the spirit and scope of the invention as defined in the following claims.

What is claimed is:

1. A semiconductor device comprising:
  a sensing voltage line disposed between a first circuit area and a second circuit area, and configured to transfer a sensing voltage detected in the second circuit area to the first circuit area;
  a first internal voltage line disposed between the first circuit area and the second circuit area, configured to transfer an internal voltage, generated by a voltage driver of the first circuit area using the sensing voltage provided through the sensing voltage line, to the second circuit area, and configured to shield the sensing voltage line; and
  a second internal voltage line disposed between the first circuit area and the second circuit area, and configured to transfer an internal voltage, generated by an additional voltage driver of the first circuit area on the basis of the sensing voltage provided through the sensing voltage line, to the second circuit area.

2. The semiconductor device according to claim 1, wherein the first internal voltage line is disposed adjacent to the sensing voltage line and on both sides of the sensing voltage line.

3. The semiconductor device according to claim 1, further comprising:
   a ground voltage line configured to shield the first internal voltage line.

4. The semiconductor device according to claim 3, wherein the ground voltage line is disposed to be separated from the sensing voltage line with the first internal voltage line interposed therebetween.

5. The semiconductor device according to claim 1, further comprising:
   a ground voltage line configured to shield the second internal voltage line.

6. The semiconductor device according to claim 1, wherein the second internal voltage line is configured to shield the sensing voltage line.

7. The semiconductor device according to claim 6, wherein the first internal voltage line and the second internal voltage line are disposed adjacent to the sensing voltage line on opposite sides of the sensing voltage line.

8. The semiconductor device according to claim 6, further comprising:
   a ground voltage line configured to shield the first internal voltage line and the second internal voltage line.

9. The semiconductor device according to claim 6, wherein a ground voltage line is disposed to be separated from the sensing voltage line with the first internal voltage line and the second internal voltage line interposed therebetween.

10. The semiconductor device according to claim 1, wherein the sensing voltage is a local ground voltage of the second circuit area or a voltage proportional to a local ground voltage of the second circuit area.

11. A semiconductor device comprising:
   a first voltage driver disposed in a first circuit area and configured to generate a first internal voltage whose level changes according to a variation in a level of a sensing voltage detected in a second circuit area;
   a second voltage driver disposed in the second circuit area and configured to generate a second internal voltage using the first internal voltage;
   a sensing voltage line disposed between the first circuit area and the second circuit area, and configured to transfer the sensing voltage to the first voltage driver;
   a first internal voltage line disposed between the first circuit area and the second circuit area, configured to transfer the first internal voltage generated by the first voltage driver to the second voltage driver, and configured to shield the sensing voltage line;
   an additional first voltage driver disposed in the first circuit area, and configured to generate an additional first internal voltage whose level changes according to a variation in a level of the sensing voltage; and
   a second internal voltage line configured to transfer the additional first internal voltage to the second circuit area and to shield the sensing voltage line.

12. The semiconductor device according to claim 11, further comprising:
   a ground voltage line configured to shield the first internal voltage line.

13. The semiconductor device according to claim 11, wherein the first internal voltage line and the second internal voltage line are disposed adjacent to the sensing voltage line and on opposite sides of the sensing voltage line.

14. The semiconductor device according to claim 11, further comprising:
   a ground voltage line configured to shield the first internal voltage line and the second internal voltage line.

15. A semiconductor device comprising:
   a sensing voltage line disposed between a first circuit area and a second circuit area, and configured to transfer a sensing voltage detected in the second circuit area to the first circuit area;
   a first internal voltage line disposed between the first circuit area and the second circuit area, configured to transfer a first internal voltage, generated by a first voltage driver of the first circuit area using the sensing voltage provided through the sensing voltage line, to the second circuit area, and configured to shield the sensing voltage line; and
   a second internal voltage line disposed between the first circuit area and the second circuit area, and configured to transfer a third internal voltage, generated by an additional voltage driver of the first circuit area on the basis of the sensing voltage provided through the sensing voltage line, to the second circuit area,
   wherein the second circuit area includes a second voltage driver configured to generate a second internal voltage using the first internal voltage.

16. The semiconductor device according to claim 15, wherein the first internal voltage line is disposed adjacent to the sensing voltage line and on both sides of the sensing voltage line.

17. The semiconductor device according to claim 15, further comprising:
   a ground voltage line configured to shield the first internal voltage line.

18. The semiconductor device according to claim 17, wherein the ground voltage line is disposed to be separated from the sensing voltage line with the first internal voltage line interposed therebetween.

19. The semiconductor device according to claim 15, further comprising:
   a ground voltage line configured to shield the second internal voltage line.

20. The semiconductor device according to claim 15, wherein the second internal voltage line is configured to shield the sensing voltage line.

* * * * *